(12) United States Patent
Takenaka et al.

(10) Patent No.: US 7,030,520 B2
(45) Date of Patent: Apr. 18, 2006

(54) DRIVE DEVICE

(75) Inventors: Masayuki Takenaka, Anjo (JP); Naruhiko Kutsuna, Anjo (JP); Kozo Yamaguchi, Anjo (JP)

(73) Assignee: Aisin AW Co., Ltd., Anjo (JP)

( * ) Notice: Subject to any disclaimer, the term of this patent is extended or adjusted under 35 U.S.C. 154(b) by 0 days.

(21) Appl. No.: 10/501,073

(22) PCT Filed: May 8, 2003

(86) PCT No.: PCT/JP03/05749

§ 371 (c)(1),
(2), (4) Date: Jul. 9, 2004

(87) PCT Pub. No.: WO2004/025809

PCT Pub. Date: Mar. 25, 2004

(65) Prior Publication Data

US 2005/0006963 A1   Jan. 13, 2005

(30) Foreign Application Priority Data

Sep. 13, 2002   (JP) .............................. 2002-269232

(51) Int. Cl.
*H02K 9/00* (2006.01)

(52) U.S. Cl. ...................................... 310/64
(58) Field of Classification Search ................ 310/52, 310/54, 58, 64
See application file for complete search history.

(56) References Cited

U.S. PATENT DOCUMENTS

| 5,491,370 | A | 2/1996 | Schneider et al. |
| 5,585,681 | A | 12/1996 | Bitsche |
| 5,821,653 | A * | 10/1998 | Kinto et al. ................... 310/89 |
| 6,198,183 | B1 | 3/2001 | Baeumel et al. |
| 6,236,566 | B1 | 5/2001 | Regnier et al. |
| 6,323,613 | B1 | 11/2001 | Hara et al. |
| 6,472,785 | B1 * | 10/2002 | Petit et al. ..................... 310/71 |
| 6,833,641 | B1 * | 12/2004 | Uchida et al. ................. 310/54 |
| 2001/0014029 | A1 | 8/2001 | Suzuki et al. |

FOREIGN PATENT DOCUMENTS

| JP | A 5-292703 | 11/1993 |
| JP | A 6-326226 | 11/1994 |
| JP | A 7-288949 | 10/1995 |
| JP | A 7-298552 | 11/1995 |
| JP | A 2001-119898 | 4/2001 |
| JP | A 2001-238405 | 8/2001 |
| JP | A 2001-238406 | 8/2001 |

* cited by examiner

*Primary Examiner*—Darren Schuberg
*Assistant Examiner*—Nguyen Hanh
(74) *Attorney, Agent, or Firm*—Oliff & Berridge PLC (57) ABSTRACT

A drive unit including an electric motor, a drive unit casing accommodating therein the electric motor, an inverter that controls the electric motor and a flow passage in which a refrigerant passes therein in order to cool the inverter, wherein the inverter is mounted on the drive unit casing such that a heat sink, united with a substrate of the inverter, defines a space that is in communication with the flow passage on a portion thereof opposed to the drive unit casing, the space is compartmented by a separator into a first chamber facing the heat sink and a second chamber facing the drive unit casing and the heat sink comprises heat-sink side fins extending into the first chamber and apart from the separator.

20 Claims, 8 Drawing Sheets

DRIVE DEVICE

INCORPORATION BY REFERENCE

This application claims priority from Japanese Patent Application No. 2002-269232, filed Sep. 13, 2002 through International Application No. PCT/JP03/05749, filed May 8, 2003, the disclosures of which are incorporated by reference thereto.

BACKGROUND OF THE INVENTION

1. Field of the Invention

The invention relates to a cooling technique in drive units for electric cars and drive units for hybrid cars.

2. Description of Related Art

When an electric motor is used as a power source for vehicles, the electric motor needs a control device (an inverter in the case of an AC electric motor) that controls the electric motor. Since the control device, for example, the inverter, is connected to the electric motor by way of a power cable, the control device can be arranged in an appropriate position apart from the electric motor. For the convenience of a car-mounted arrangement, it is desired that the control device be united with the electric motor.

By the way, current control devices are lower in heat-resistant temperature than electric motors. Hereupon, when a control device is to unite with an electric motor in the above-mentioned manner, certain devices that cut off direct heat conduction from the electric motor to the control device is needed in order to protect the control device. Also, since the temperature of the control device is raised due to heat generation by the elements of the control device, cooling is necessary in order to maintain the control device at the heat-resistant temperature thereof or lower.

Conventionally, U.S. Pat. No. 5,491,370 describes a technique that is thought to be useful for improving such a problematic matter. This technique adopts a construction in which a cooling channel (spiral passage) is formed on an outer periphery of a cylindrical-shaped inner body (housing) of an electric motor. A cooling saddle is also formed on a part of a jacket (sleeve) externally mounted on the housing in a manner that covers an opening surface side of the passage with a control housing receiving therein an IGBT module (inverter component) mounted on the cooling saddle. With this construction, a cooling space is defined on facing portions of the control housing and the cooling saddle. Circulation of the cooling fluid is carried out with the cooling fluid, fed from a water pump, flowing to the spiral passage via the cooling space, passing through a heat exchanger and returning to the water pump.

Also, another technique is proposed in JP-A-5-292703 and adopts a construction in which a motor body and a controller are united together with a heat sink therebetween. A cooling liquid is allowed to flow through an interior of the heat sink to cool the controller and the cooling liquid having flowed is fed to the motor body to cool the motor body.

SUMMARY OF THE INVENTION

With the conventional construction of the former technique, since a chassis of the inverter component is arranged in a floating state relative to the control housing, thermal insulation between the cylindrical-shaped inner body and the inverter component appears to be excellent. However, effective cooling of the inverter component by the cooling liquid is not expected. With this technique, since a tip end of a wall that defines the spiral passage on the cylindrical-shaped inner body contacts directly with the jacket, heat transfer to a saddle portion that defines a cooling space for the inverter component is thought to increase, which is not efficient in terms of cooling efficiency.

On the other hand, with the conventional construction of the latter technique, since the controller contacts directly with the heat sink, a cooling effect on the controller can be expected of the cooling liquid. Also, since there is provided a gap that reduces an area, in which the heat sink and the motor body abut directly against each other, the effect of thermal insulation on the gap portion can be expected of the cooling liquid. However, since a layer of thermal insulation constituted by the cooling liquid contacts with both the motor body and the heat sink, a cooling liquid circulating system of a large capacity is required to lower the temperature of the cooling liquid to the heat-resistant temperature of the controller in order to protect the controller, in which case the technique is not efficient in terms of cooling efficiency.

The invention thus provides, among other things, an apparatus and a method that efficiently cools an electric motor and an inverter while minimizing the amount of refrigerant that is used according to heat-resistant temperatures thereof in a drive unit, in which the inverter is united with the electric motor. The electric motor and inverter are cooled by creating a temperature difference between a refrigerant that cools the electric motor and a refrigerant that cools the inverter while cutting off thermal conduction from the electric motor to the inverter with the use of the refrigerant.

In order to attain the foregoing, according an exemplary aspect, a drive unit includes an electric motor, a drive unit casing accommodating therein the electric motor an inverter that controls the electric motor and a flow passage in which a refrigerant passes therein in order to cool the inverter. The inverter is mounted on the drive unit casing such that a heat sink, united with a substrate of the inverter, defines a space that is in communication with the flow passage on a portion thereof opposed to the drive unit casing. The space is compartmented by a separator into a first chamber facing the heat sink and a second chamber facing the drive unit casing and the heat sink comprises heat-sink side fins extending into the first chamber and apart from the separator.

BRIEF DESCRIPTION OF THE DRAWINGS

Various embodiments of the invention are described with reference to the drawings, wherein.

DETAILED DESCRIPTION OF PREFERRED EMBODIMENTS

Figure 1:
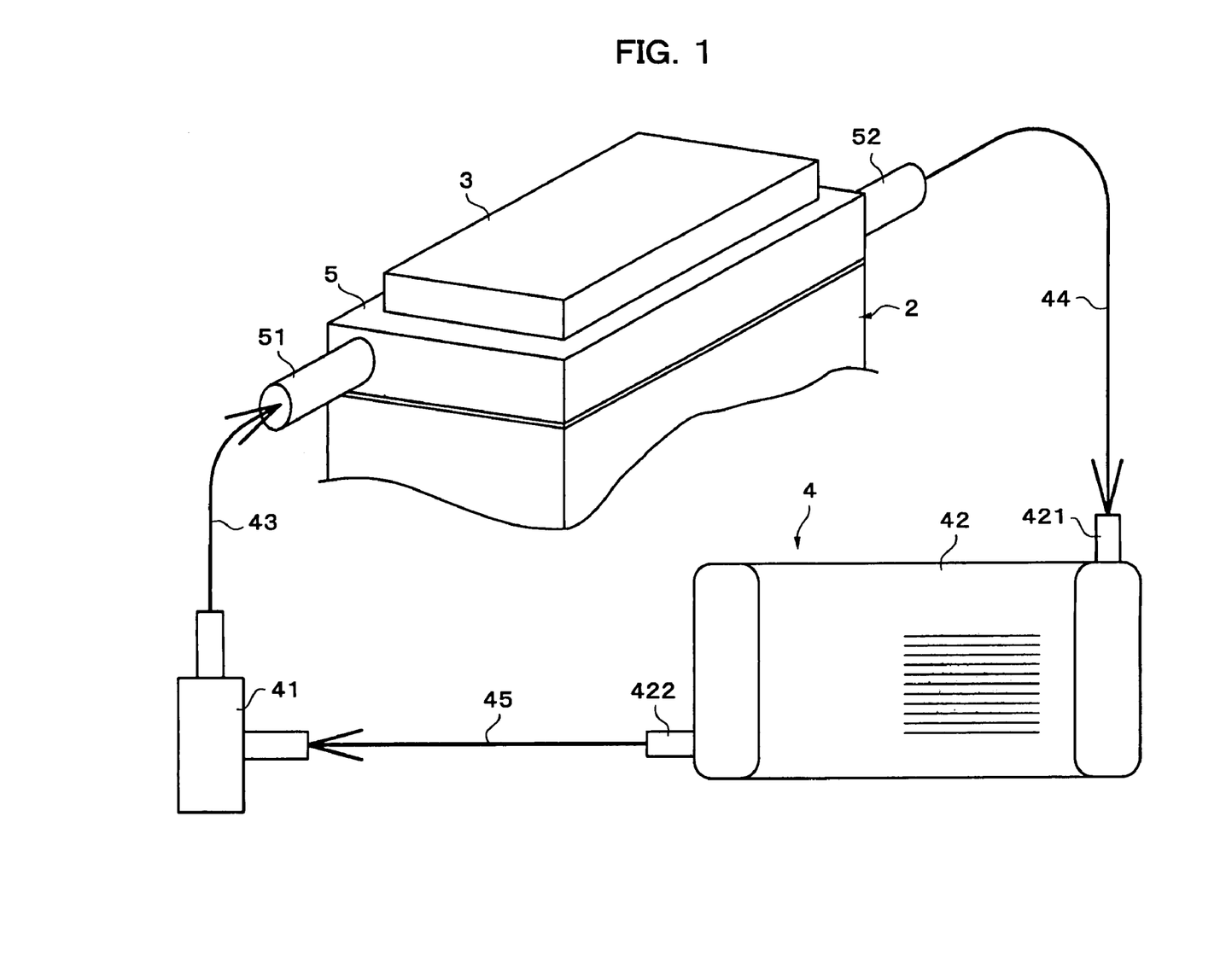
FIG. 1 is a view showing a configuration of a cooling system of a drive unit according to the invention.

Embodiments of the invention will be described below with reference to the drawings. First, FIG. 1 schematically and conceptionally shows a cooling system of a drive unit, to which the invention is applied. The drive unit comprises an electric motor 1 (FIG. 2), a drive unit casing 2 that accommodates therein the electric motor 1, an inverter 3 that controls the electric motor 1, and a flow passage 4 with a refrigerant that cools the inverter 3. An inverter, as referred to in the specification, is a power module composed of a switching transistor and associated circuit elements that convert DC of a battery power source into AC (three-phase AC in the case where the electric motor is a three-phase AC electric motor) under the switching action, and a circuit board arranging thereon the switching transistor and the associated circuit elements. The drive unit in this embodiment is used for electric cars or hybrid cars, and the drive unit casing 2 accommodates therein a motor or a generator or both thereof as an electric motor 1, a differential device, and an accessory mechanism such as counter gear mechanism. A heat sink 5 includes a substrate of the inverter 3, or is made integral with the substrate by attaching a separate member to the substrate, the heat sink 5 is mounted to the drive unit casing 2 while a space is defined in a region opposed to the drive unit casing 2, with the space communicated with the refrigerant flow passage 4. In this embodiment, the refrigerant flow passage 4 makes a refrigerant circulation path in which a refrigerant circulates through the space on the heat sink 5.

The refrigerant circulation path, in which cooling water as a refrigerant circulates through the heat sink 5, comprises a water pump 41 as a pressure feed source, a radiator 42 as a heat exchanger, and flow passages 43, 44, 45 that connect the water pump 41 and the radiator 42. In addition, illustration of accessory equipment such as a drive motor of the water pump 41 is omitted. The discharge-side flow passage 43 of the water pump 41 as a starting point of the refrigerant circulation path is connected to a port 51 on an inlet side of the heat sink 5, a port 52 on an outlet side of the heat sink 5 is connected to an inlet 421 side of the radiator 42 via the return flow passage 44, and an outlet 422 side of the radiator 42 is connected to the suction-side flow passage 45 of the water pump 41. Accordingly, cooling water as a refrigerant in the refrigerant circulation path is fed from the water pump 41, absorbs heat from a module that constitutes the inverter 3 and heat of the drive unit casing 2 when flowing through the space in the heat sink 5, is fed into the radiator 42 via the return flow passage 44 and cooled due to radiation of heat into the air, and is returned to the water pump 41. In addition, the refrigerant circulation path can also include a return path in the return flow passage 44 such that the cooling water returns to drive the unit casing 2 at least once for further cooling before flowing through the radiator 42.

Figure 2:
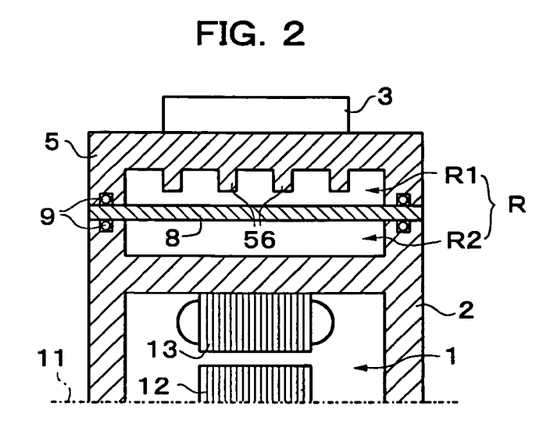
FIG. 2 is a schematic view showing a longitudinal cross section, in an axial direction, of a drive unit according to a first embodiment.

Subsequently, FIG. 2 schematically shows a longitudinal cross sectional view, in an axial direction, of the drive unit according to a first embodiment. Reference numeral 1 denotes the electric motor, 11 a rotor shaft of the motor, 12 a rotor core, and 13 a stator core. As shown in the figure, a space R defined in a region, in which the heat sink 5 is opposed to the drive unit casing 2, is compartmented by a separator 8 into a first chamber R1 facing the heat sink and a second chamber R2 facing the drive unit casing 2, and is communicated to the flow passage of the refrigerant as described above. The heat sink 5 comprises a multiplicity of heat-sink side fins 56 extending into the first chamber R1 to ensure a heat exchange area and disposed apart from the separator 8. In addition, the respective fins 56 are shown, in all the drawings, as being enlarged and exaggerated in dimension relative to the space R and the number of the fins as shown is less than the number of fins actually arranged for the purpose of avoiding complexity in the drawings.

Figure 3:
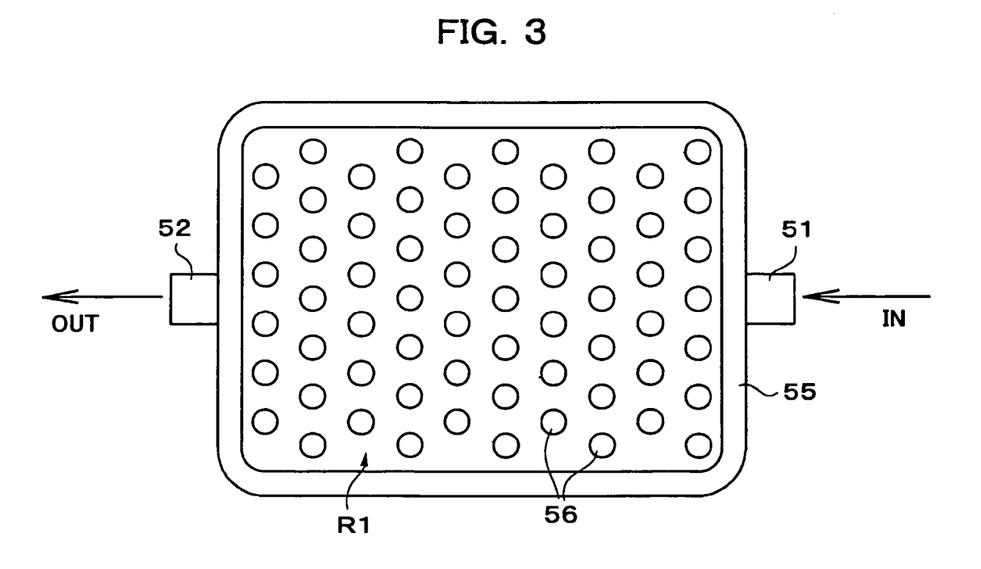
FIG. 3 is a schematic plan view showing a pin-shaped-fin arrangement pattern.

Next, FIG. 3 schematically shows a pattern that arranges the heat-sink side fins 56 as viewed in a plan view. The heat-sink side fins 56 comprise a multiplicity of pin-shaped fins in the form of a column arranged lengthwise and crosswise at a predetermined pitch relative to the first chamber R1. A natural flow in the first chamber R1 is thus generated with a minimum amount of restriction by the fins 56. Restriction of the flow is minimized by the fins 56 based on the predetermined pitch and the shape of the fins 56. Such an adoption for the pin-shaped fins 56 is advantageous in that pressure loss in the refrigerant flow within the first chamber R1 can be extremely reduced.

Figure 4:
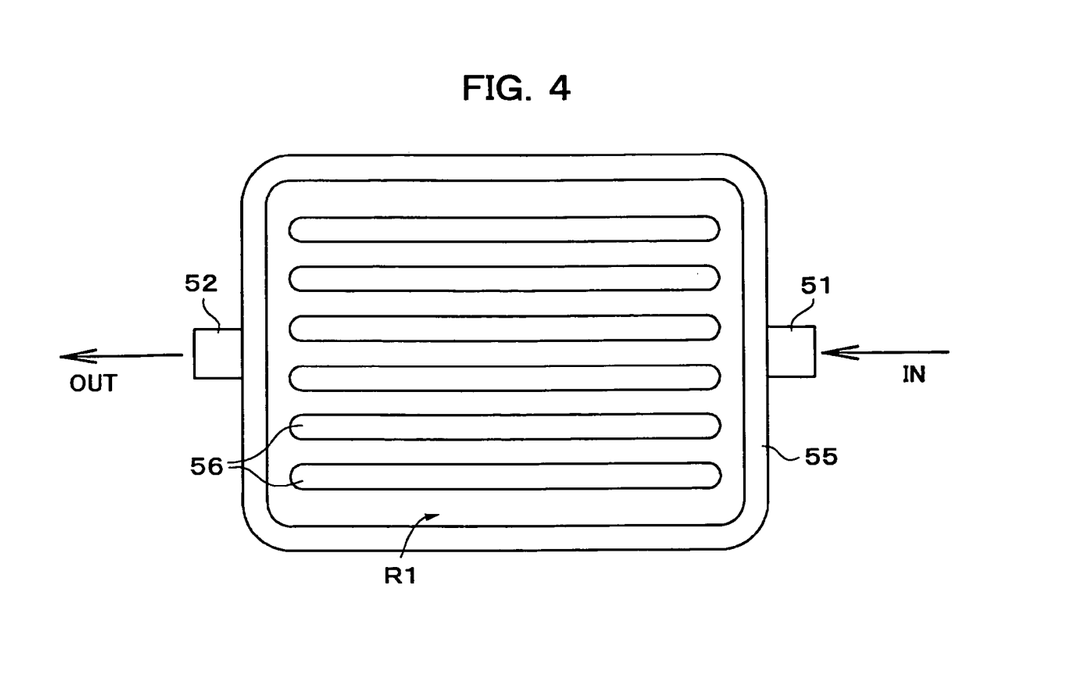
FIG. 4 is a schematic plan view showing a rib-shaped-fin arrangement pattern.

Other patterns that provide a different arrangement for the fins 56 can also be adopted. Next, FIG. 4 shows, in plan, a modified example of a pattern that arranges the heat-sink side fins 56 in the same manner as in FIG. 3. In this case, the heat-sink side fins 56 comprise rib-shaped fins in the form of a plate, which are aligned in parallel between the inlet-side port 51 and the outlet-side port 52 and are arranged at equal intervals. Both lengthwise ends of the fins 56 terminate with a predetermined gap between them and the peripheral wall 55 of the heat sink 5 so that spaces between the respective fins 56 are communicated to the inlet-side port 51 and the outlet-side port 52. Such an arrangement for the fins 56 defines, in the first space R1 parallel to a direction in which the refrigerant flows, passages with both ends of the passages communicating with the inlet-side port 51 and the outlet-side port 52. The passages are also separated midway from one another by the fins 56.

Figure 5:
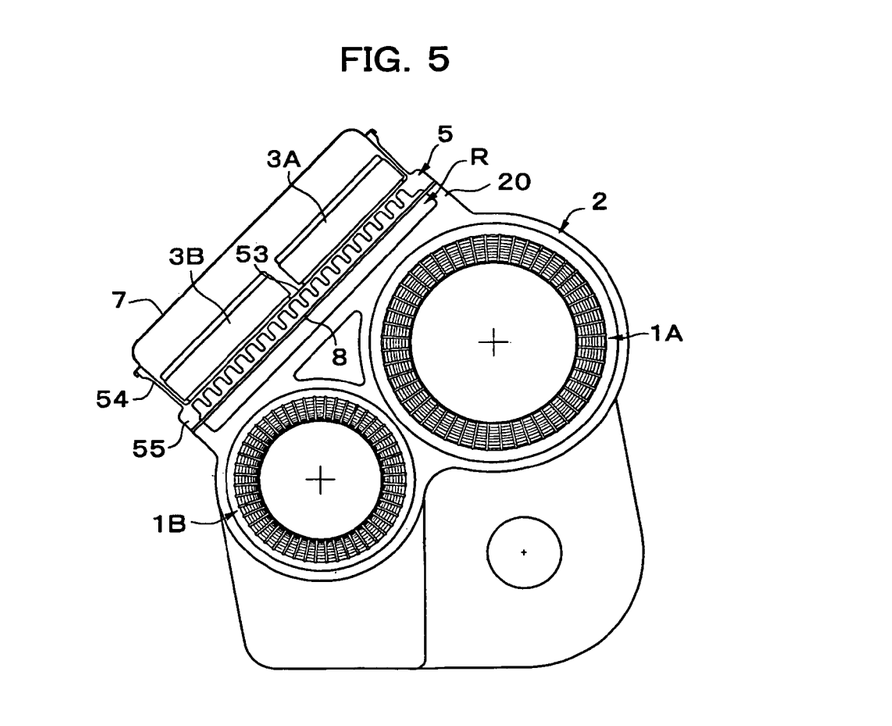
FIG. 5 is a side view showing, partially in section, an example in which the drive unit according to the first embodiment is embodied.

Next, FIG. 5 shows an example, in which the construction of the first embodiment is applied to a drive unit, of a hybrid car provided with two electric motors. In this example, as viewed in an axial direction, a motor 1A as a first electric motor is arranged in an upper position. A differential device, with only a position of a shaft shown, is arranged substantially below the motor 1A. A generator 1B is also shown as a second electric motor arranged in a middle position to be disposed forwardly thereof in a car-mounted state.

A mount 20 for the heat sink 5 is formed integral with an upper portion of the drive unit casing 2. The mount 20 for the heat sink 5 is provided in a manner so as to project obliquely on the upper portion of the casing 2 so as to contact with outer peripheries of two sections that receive the electric motors, and is in the form of a base, a plane outline of which substantially corresponds to that of the heat sink 5. A recess is formed on a side of a surface of the mount 20 that faces the heat sink 5, and this recess constitutes a second chamber (corresponding to the second chamber R2 in FIG. 2).

In the embodiment, the heat sink 5 comprises a member separate from the substrate of the inverter 3, is in the form of a casing provided with a peripheral wall 54 that is rectangular in plan view, extends upward from a bottom wall 53 thereof in a manner to surround the outline in a frame-like manner, and has an interior thereof serving as a space that accommodates therein the inverter 3. Two modules 3A, 3B, for the motor 1A and the generator 1B, that comprises the inverter 3 are tightly fixed to the bottom wall 53 of the heat sink 5 that is finished flat so as to closely mount thereto the modules 3A, 3B in a manner not to generate the resistance of heat conduction. An upper opening of the heat sink 5 is closed by a cover 7 so that the inverter 3 therein is protected from rain, water and dust. Provided on the bottom wall 53 of the heat sink 5 is a peripheral wall 55 that is rectangular in plan view and extends downward in a manner to surround the outline thereof, whereby a first chamber (corresponding to the first chamber R1 in FIG. 2) of the space R is surrounded by the peripheral wall to be defined.

The heat sink 5 constructed in this manner causes an end surface of the peripheral wall 55 to abut against a mount surface of the drive unit casing 2 with a plate-shaped separator 8 therebetween. The separator 8 is externally dimensioned to correspond to a portion of the heat sink 5 opposed to the drive unit casing 2, that is, an external shape of the mount 20 of the drive unit casing 2. The separator 8 is also externally dimensioned to correspond to an external shape, in plan view, of the heat sink 5. The separator 8 is also subjected to sealing at a periphery thereof by a sealing material 9 (see FIG. 2) such as an O-ring or the like and fixed integrally by appropriate fixation such as bolting.

With the construction of the first embodiment, since a refrigerant flowing in the space R interposed between the heat sink 5 and the drive unit casing 2 serves as a layer of thermal insulation, heat transferred to the heat sink 5 from the drive unit casing 2 is cut off and the inverter 3 united with the drive unit can be protected from the high temperature of the drive unit. Also, since the space R is compartmented by the separator 8 into two layers, that is, the first chamber R1 and the second chamber R2 (see FIG. 2), it is possible to provide a temperature gradient between both chambers, whereby cooling of the heat sink 5 and the drive unit casing 2 can be made possible with a lower flow rate for the refrigerant as compared with the case where the entire space comprising a single layer is cooled by the refrigerant according to the heat-resistant temperature of the inverter 3. By providing a lower flow rate, the amount of refrigerant that is used is reduced. Further, since the heat-sink side fins 56 are not brought into contact with the drive unit casing 2, heat transfer from the second chamber R2 to the first chamber R1 with the separator 8 therebetween becomes small. As such, both chambers R1, R2 create two layers that can make the effect of thermal insulation effective.

Figure 6:
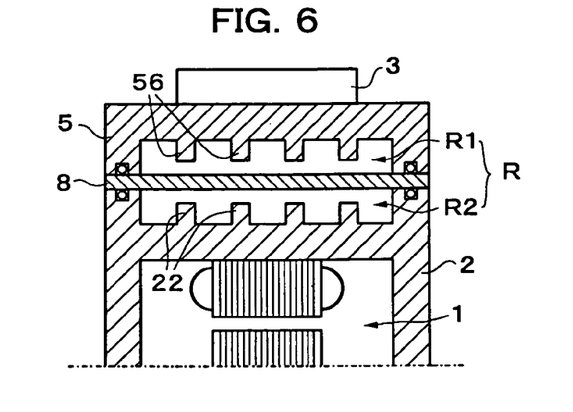
FIG. 6 is a schematic view showing a longitudinal cross section, in an axial direction, of a drive unit according to a second embodiment.

Next, FIG. 6 shows a second embodiment that is the same in fundamental construction as the first embodiment. In this embodiment, a heat sink 5 is the same as that in the first embodiment in that the heat sink 5 comprises heat-sink side fins 56 extending into a first chamber R1. However, according to this embodiment a drive unit casing 2 also comprises drive-unit-casing side fins 22 extending into a second chamber R2. The drive-unit-casing side fins 22 are also apart from the separator 8. Since a remaining portion of the construction is the same as that in the first embodiment, an explanation is replaced by the same reference numerals that denote corresponding members. This is the same with other following embodiments.

Figure 7:
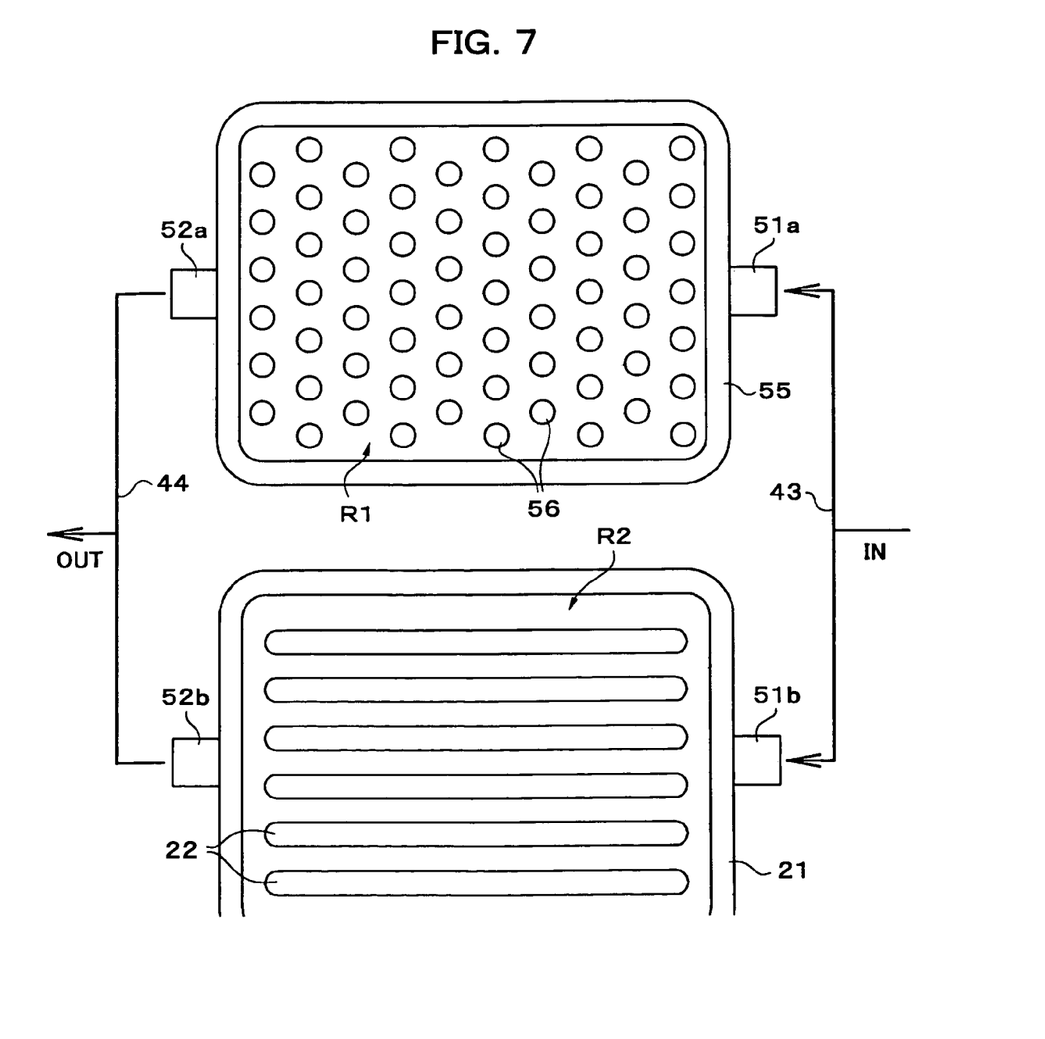
FIG. 7 is a schematic plan view showing a fin arrangement according to the second embodiment, in which facing surfaces of a heat sink and a drive unit casing are aligned in the same plane.

In this manner, when the fins 56, 22 are formed on both sides of the heat sink 5 and the drive unit casing 2, both fins 56,22 can adopt the same pin-shaped fin or rib-shaped fin configuration as that of the first embodiment or modifications thereof shown in FIG. 3 or FIG. 4, and further can adopt a fin configuration shown in FIG. 7. Next, FIG. 7 shows, in schematic plan, an arrangement pattern adoptable in the embodiment, in which the heat-sink side fins 56 and the drive-unit-casing side fins 22 are arranged, and a bottom surface of the heat sink 5 and an opposed mount surface on the side of the drive unit casing 2 are aligned in the same plane. In this case, the heat-sink side fins 56 extending into the first chamber R1 comprise pin-shaped fins so as to reduce pressure loss in flow passages and the drive-unit-casing side fins 22 comprise rib-shaped fins that are excellent in making the flow uniform.

Here, the relationship between the connection of the space R to the refrigerant circulating path, which has not been referred to in the description of the first embodiment, will be described. When the space R is compartmented, as in the invention, how the respective chambers R1, R2 are connected to a refrigerant circulating path is problematic. In the example shown in FIG. 7, inlet ports 51a, 51b of the respective chambers R1, R2 are simply connected to a discharge-side flow passage 43 (see FIG. 1 for the relationship of this flow passage to the refrigerant circulating path) and outlet ports 52a, 52b are connected to a return flow passage 44 (likewise, see FIG. 1). Thus, both chambers are connected to the refrigerant circulating path in a parallel relationship with each other.

When such a fin arrangement pattern and such a connection to the flow passages are adopted, flow resistance is smaller on a side of the first chamber R1 than on a side of the second chamber R2. As such, the flow rate on the side of the first chamber R1 becomes relatively large as compared to the flow rate on the side of the second chamber R2. Cooling of an inverter 3 and the drive unit casing 2 can be efficiently carried out with less flow rate by increasing the cooling capacity on a side of the heat sink 5 to provide a temperature gradient between the both chambers R1, R2 according to a low heat-resistant temperature of the inverter 3.

Figure 8:
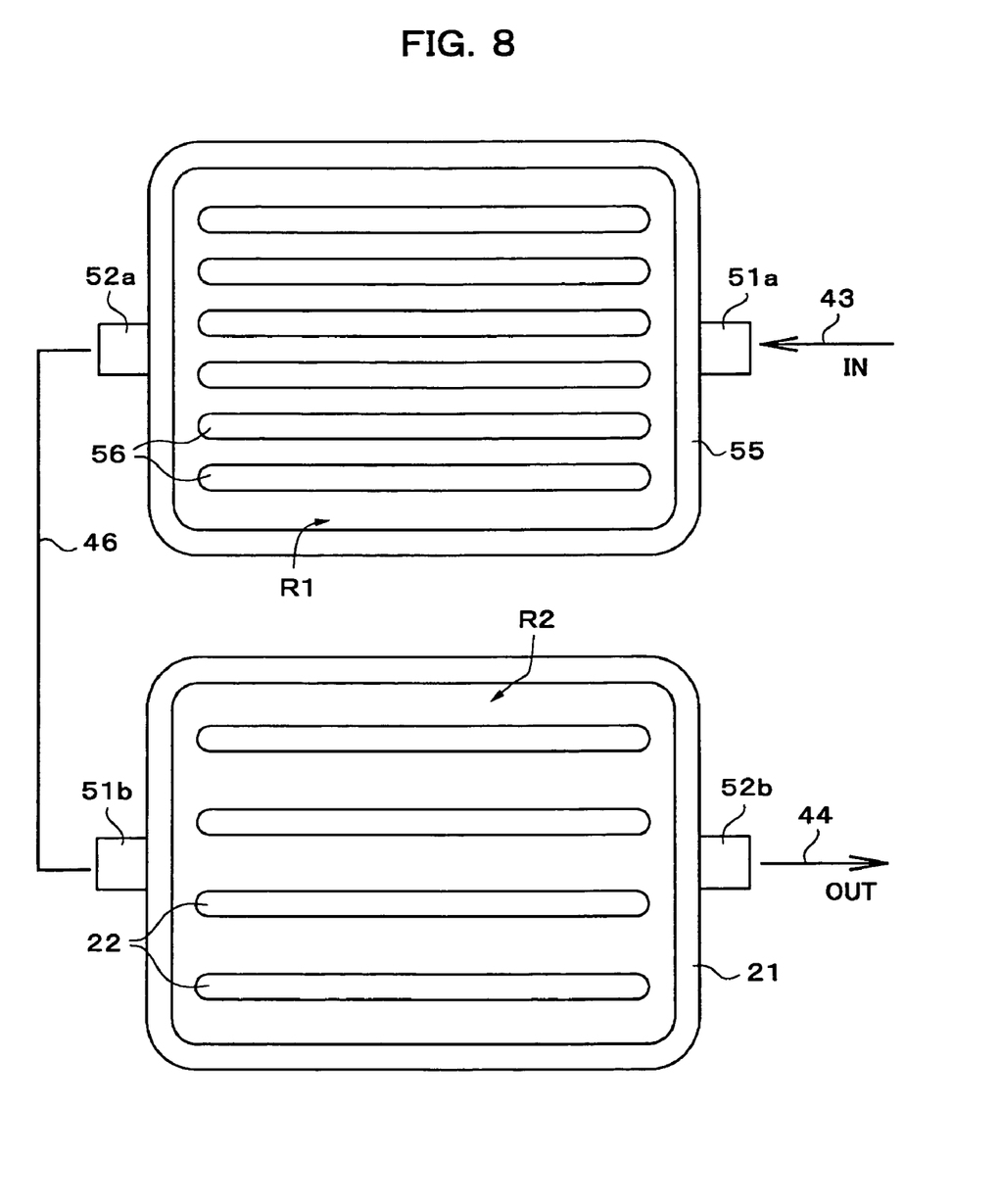
FIG. 8 is a schematic plan view showing another fin arrangement according to the second embodiment, in which facing surfaces of a heat sink and a drive unit casing are aligned in the same plane.

Next, FIG. 8 shows a modification, in which the fin arrangement pattern and the relationship of the connection with the refrigerant circulating path are further changed, in the same manner as in FIG. 7. In this case, both the heat-sink side fins 56 extending into the first chamber R1 and the drive-unit-casing side fins 22 extending into the second chamber R2 comprise rib-shaped fins, while the heat-sink side fins 56 are arranged at smaller intervals than that for the drive-unit-casing side fins 22. Also, in this modification, the inlet port 51a of the first chamber R1 is connected to the discharge-side flow passage 43, the outlet port 52a is connected to the inlet port 51b of the second chamber R2 via a connection flow passage 46, the outlet port 51b of the second chamber R2 is connected to the return flow passage 44. Both chambers are thus connected in series to the refrigerant circulating path.

When such a fin arrangement pattern and such a connection to the flow passages are adopted, a cooling area (a fin surface area in contact with the refrigerant) on the side of the first chamber R1 is larger than that on the side of the second chamber R2 even when both of the chambers R1, R2 are equal to each other in thickness. A cooling effect on the side of the first chamber R1 thus becomes relatively large. Accordingly, by making use of the above arrangement, cooling of the inverter 3 and the drive unit casing 2 can be efficiently carried out with less flow rate in the same manner as the case described above by increasing the cooling capacity on a side of the heat sink 5 to provide temperature gradient between the both chambers according to a low heat-resistant temperature of the inverter 3.

In this manner, with respect to a fin arrangement pattern, it is possible according to the desired cooling effect to appropriately select a fin arrangement that includes fins of the same type and in the same number, a combination of fins of different types, and a fin arrangement that includes fins of the same type and in different numbers. Also, the connection of both chambers R1, R2 to the refrigerant circulating path can be appropriately selected according to the relationship of the desired cooling effect and a fin arrangement pattern as employed.

Figure 9:
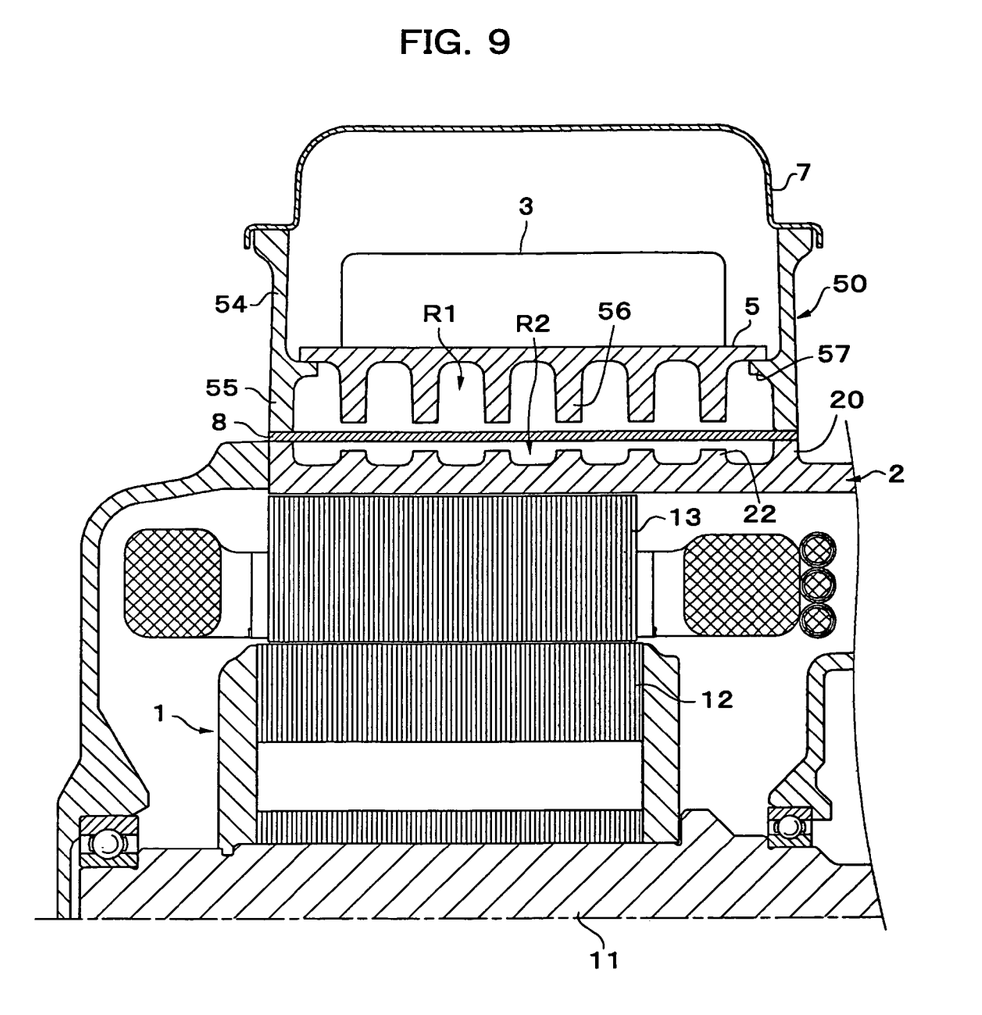
FIG. 9 is a view showing a longitudinal, cross section, in an axial direction, of an example in which the drive unit according to the second embodiment is embodied.

Next, FIG. 9 shows a modification, in which the second embodiment is made further concrete. Unlike the modification, in which the first embodiment is made concrete, this modification illustrates the case where a heat sink is composed of a module substrate itself with respect to unification of a substrate of an inverter with a heat sink. In the modification, since the heat sink 5 is annexed to a side of the inverter 3, the heat sink 5 is fixed to an inverter casing 50 comprising a separate member from the heat sink 5 and mounted to a drive unit casing 2 through the inverter casing 50. Accordingly, the drive unit casing 2 in this modification is the same as that in the previous embodiment in substantial construction while a mount 20 in an upper portion of the drive unit casing serves as a mount for the inverter casing 50. More specifically, the mount 20 for the inverter casing 50 is in the form of a base, a plane outline of which substantially corresponds to that of the inverter casing 50. A recess is formed on a side of a surface of the mount 20 that faces the heat sink 5, and this recess constitutes a second chamber (corresponding to the second chamber R2 in FIG. 6).

That portion of the inverter casing 50, corresponds to the bottom wall 53 (see FIG. 5) in the previous modification, except that a peripheral shelf-shaped portion 57 serves as an opening, and the shelf-shaped portion 57 serves as a portion that fixes thereto and supports thereon the heat sink 5. In this manner, since the inverter casing 50 comprises a separate member from the heat sink 5, appropriate sealing, of which illustration is omitted, is inserted in a fixing portion of the shelf-shaped portion 57 around the heat sink 5, to which the heat sink 5 is to be fixed. Sealing is thus applied between the inverter casing 50 and the heat sink 5. Except the above, the present modification is substantially the same as the previous modification, and an explanation of the remaining portion is replaced by the same reference numerals that denote corresponding members. In this modification, a first chamber (corresponding to the first chamber R1 in FIG. 6) of a space R is surrounded and defined by an underside of the heat sink 5 and a rectangular-shaped peripheral wall 55 below the shelf-shaped portion 57 of the inverter casing 50.

Figure 10:
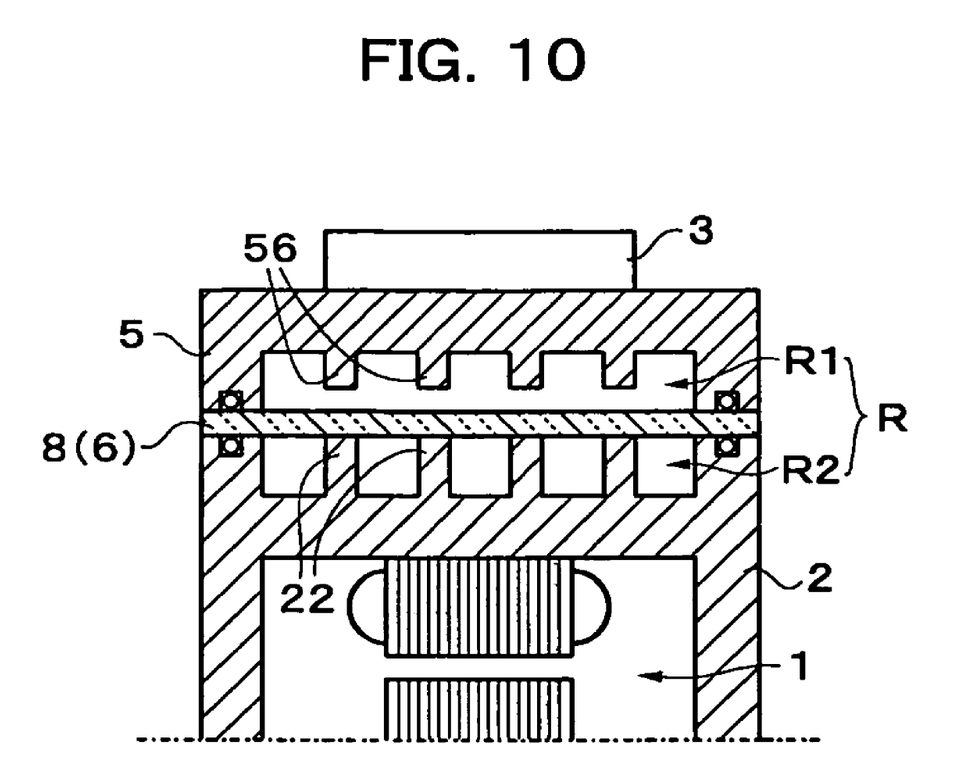
FIG. 10 is a schematic view showing a longitudinal cross section, in an axial direction, of a drive unit according to a third.
Figure 11:
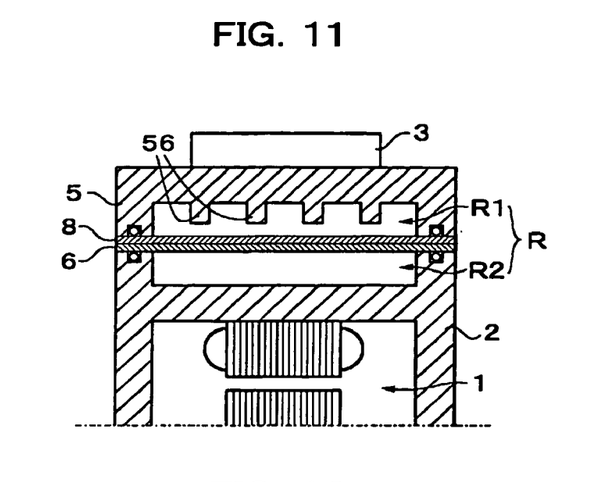
FIGS. 11–13 are schematic views showing a longitudinal cross section, in an axial direction, of a drive unit according to a modification of the embodiments.
Figure 12:
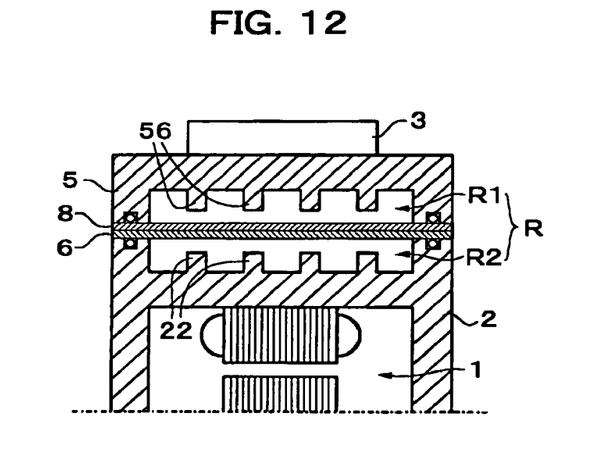
Figure 13:
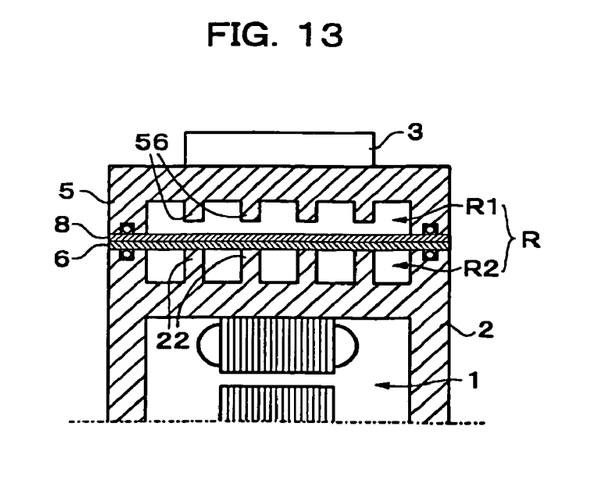

Both of the two embodiments described above make exclusive use of a refrigerant as a layer of thermal insulation without taking account of the heat conductive property of the separator 8. When a low thermal conductive member 6 made of a material of low thermal conductivity, that is, a thermal insulating material is used for the separator 8 or a low thermal conductive member, such as film-shaped member or the like, made of a material of low thermal conductivity is provided along and arranged on a member of a metallic material, that comprises the separator 8 as a backing, at least drive-unit-side fins 22 can be configured to contact directly with a low thermal conductive member 6 that constitutes the separator 8, or a member provided along the low thermal conductive member. Next, a third embodiment shown in FIG. 10 adopts such a construction. FIGS. 11–13 illustrate a modification of the embodiments where the low thermal conductive member 6 is provided along the separator 8. In addition, the low thermal conductive member 6 referred herein to does not necessarily mean a member made of a single material but includes a member formed by laminating a plurality of different materials that include a coating.

The third embodiment adopts a construction, in which the separator 8 comprises a low thermal conductive member 6 made of a material of low thermal conductivity, and tip ends of drive-unit-side fins 22 contact with the low thermal conductive member 6. With this construction, since the separator 8 comprises the low thermal conductive member 6, any special consideration is not necessarily taken of a contact area of the tip ends of the drive-unit-side fins 22 with the separator 8. However, in order to reduce a contact area on the low thermal conductive member 6, it is effective that an arrangement pattern of the drive-unit-side fins 22 is composed of pin-shaped fins.

In the case where such construction is adopted, since the separator 8 that separates the first chamber R1 and the second chamber R2 from each other serves as the thermal insulating material 6 for a thermal insulating layer, three thermal insulation layers in all including two layers of the refrigerant and a layer formed from the low thermal conductive member 6 are provided between the drive unit casing 2 and the heat sink 5 to further improve the effect of thermal insulation. Also, in the case where the low thermal conductive member being film-shaped or the like is arranged on a side in contact with the drive-unit-casing side fins 22, tip ends of the drive-unit-casing side fins 22 support the low thermal conductive member, so that floating of the low thermal conductive member from the separator 8 can be prevented without the use of any special sticking means such as adhesion or the like.

While the invention has been described above in detail on the basis of three embodiments, it is not limited to such embodiments but can be embodied with its concrete construction modified variously within the scope described in the claims. For example, while the separator in the first and second embodiments is exemplarily composed of a single-layered member, it can be composed of a multi-layered member, or constructed therefrom. In this case, it is effective that the separator be composed of, for example, a plurality of separation members with low thermal conductive portions therebetween, and the low thermal conductive portions be made, for example, a solid thermal insulating material, or a refrigerant flowing space similar to the first chamber R1 and the second chamber R2.

Also, in the case where the low thermal conductive member 6 in the third embodiment comprises a film-shaped member or coating itself having no rigidity, it is possible to adopt a construction, in which the low thermal conductive member 6 is provided along or interposed between the separator 8 made of an appropriate material such as metallic material, ceramic material, rubber, etc. In this case, the low thermal conductive member 6 may be provided along one surface of the separator 8 or both surfaces thereof.

Also, while the refrigerant exclusively composed of cooling water is illustrated, it is of course possible to use other appropriate refrigerants, and to construct a refrigerant circulating path of a separate system for the refrigerant that flows through the first chamber R1 and the second chamber R2.

According to an exemplary aspect of the invention, since the refrigerant flowing in the space interposed between the heat sink and the drive-unit-casing has the space serving as a thermal insulating layer, heat transferred from the drive-unit-casing to the heat sink is cut off, so that the inverter united with the drive unit, that is disadvantageous in terms of heat-resistant temperature, can be protected from the high temperature of the drive unit. Also, since the space is compartmented by the separator into two layers composed of the first chamber and the second chamber, a temperature gradient can be provided between both of the chambers, whereby cooling of the heat sink and the drive unit casing can be made possible with less flow rate of the refrigerant as compared with the case where the entire space comprising a single layer is cooled by the refrigerant according to the heat-resistant temperature of the inverter. Further, since the heat-sink side fins are not in contact with the drive unit casing, heat transfer from the second chamber to the first chamber via the separator is reduced, and the effect of thermal insulation due to the chambers that comprise two layers can be made effective.

In accordance with an exemplary aspect of the invention, since the cooling effect on the second chamber facing the drive unit casing is enhanced to thereby reduce heat transferred via the separator to the first chamber facing the heat sink, it is possible to enhance the cooling effect on the side of the first chamber.

In accordance with another exemplary aspect of the invention, the provision of the drive-unit-casing side fins makes it possible to reduce heat transferred from the drive unit casing to the separator within the second chamber while enhancing the cooling effect on the second chamber facing the drive unit casing.

In accordance with another exemplary aspect of the invention, the drive-unit-side fins may contact with the separator. With the construction, since the separator that separates the first chamber and the second chamber from each other serves as a thermal insulating layer, three thermal insulation layers in all including two layers of the refrigerant and a layer formed from the low thermal conductive member are provided between the drive unit casing and the heat sink to further improve the effect of thermal insulation.

In accordance with another exemplary aspect of the invention, since the low thermal conductive member can be provided along and supported by the separation member, a material having no rigidity can be used for the low thermal conductive member and a wide variety of materials can be selected and used for the low thermal conductive member.

In accordance with another exemplary aspect of the invention, since the intermediate portion interposed by the separation members comprises a low thermal conductive portion and the separation members themselves do not necessarily have the thermal insulating property, a wide variety of materials can be selected and used for the separation members.

The invention claimed is:

1. A drive unit, comprising:
an electric motor;
a drive unit casing accommodating therein the electric motor;
an inverter that controls the electric motor; and
a flow passage in which a refrigerant passes therein in order to cool the inverter, wherein the inverter is mounted on the drive unit casing such that a heat sink, united with a substrate of the inverter, defines a space that is in communication with the flow passage on a portion thereof opposed to the drive unit casing, the space is compartmented by a separator into a first chamber facing the heat sink and a second chamber facing the drive unit casing, and the heat sink comprises heat-sink side fins extending into the first chamber and apart from the separator.

2. The drive unit according to claim 1, wherein the drive unit casing comprises drive-unit-side fins extending into the second chamber.

3. The drive unit according to claim 2, wherein the drive-unit-side fins are apart from the separator.

4. The drive unit according to claim 3, wherein the separator comprises a low thermal conductive member made of a material of low thermal conductivity.

5. The drive unit according to claim 3, wherein the separator comprises a separation member and a low thermal conductive member provided along the separation member and made of a material of low thermal conductivity.

6. The drive unit according to claim 3, wherein the separator comprises separation members with a low thermal conductive portion therebetween.

7. The drive unit according to claim 2, wherein the separator comprises a low thermal conductive member made of a material of low thermal conductivity.

8. The drive unit according to claim 2, wherein the separator comprises a separation member and a low thermal conductive member provided along the separation member and made of a material of low thermal conductivity.

9. The drive unit according to claim 2, wherein the separator comprises separation members with a low thermal conductive portion therebetween.

10. The drive unit according to claim 1, wherein the separator comprises a low thermal conductive member made of a material of low thermal conductivity.

11. The drive unit according to claim 1, wherein the separator comprises a separation member and a low thermal conductive member provided along the separation member and made of a material of low thermal conductivity.

12. The drive unit according to claim 1, wherein the separator comprises separation members with a low thermal conductive portion there between.

13. The drive unit according to claim 1, wherein the heat-sink side fins have a column shape and are arranged lengthwise and crosswise at a predetermined pitch.

14. The drive unit according to claim 1, wherein the heat-sink side fins are rib shaped fins which are arranged parallel with the flow passage in which the refrigerant passes.

15. The drive unit according to claim 2, wherein the heat-sink side fins have a column shape and are arranged lengthwise and crosswise at a predetermined pitch and the drive-unit-side fins are rib shaped fins which are arranged parallel with the flow passage in which the refrigerant passes.

16. The drive unit according to claim 15, wherein the first chamber and the second chamber are in parallel communication with the flow passage.

17. The drive unit according to claim 1, wherein the first chamber and the second chamber are in parallel communication with the flow passage.

18. The drive unit according to claim 1, wherein the first chamber and the second chamber are in serial communication with the flow passage.

19. The drive unit according to claim 2, wherein the heat-sink side fins and the drive-unit-side fins are rib shaped fins which are arranged parallel with the flow passage in which the refrigerant passes with the heat-sink side fins arranged at smaller intervals.

20. The drive unit according to claim 2, wherein the drive-unit-side fins contact the separator.

* * * * *